United States Patent [19]

Nakayama et al.

[11] Patent Number: 4,619,316
[45] Date of Patent: Oct. 28, 1986

[54] HEAT TRANSFER APPARATUS

[75] Inventors: Wataru Nakayama, Kashiwa; Tadakatsu Nakajima, Ibaraki; Shigeki Hirasawa, Ibaraki; Akiomi Kohno, Ibaraki; Takaji Takenaka, Hatano, all of Japan

[73] Assignee: Hitachi, Ltd., Tokyo, Japan

[21] Appl. No.: 726,715

[22] Filed: Apr. 24, 1985

[30] Foreign Application Priority Data

Apr. 27, 1984 [JP] Japan .................................. 59-83708

[51] Int. Cl.$^4$ ...................... F28D 15/00; H01L 23/44
[52] U.S. Cl. ............................. 165/104.33; 165/133; 357/82; 361/385
[58] Field of Search .......................... 165/104.33, 133; 357/82; 361/385

[56] References Cited

U.S. PATENT DOCUMENTS 4,203,129  5/1980  Oktay et al. ...................... 357/82

FOREIGN PATENT DOCUMENTS 108364  5/1984  European Pat. Off. ............ 165/133

Primary Examiner—Albert W. Davis, Jr.
Attorney, Agent, or Firm—Antonelli, Terry & Wands

[57] ABSTRACT

In an apparatus wherein heat generating bodies such as integrated circuit chips are cooled by utilizing boiling of a liquid; a heat transfer apparatus characterized in that a heat conductive member which has a plurality of layers of cavity groups and apertures for bringing the cavity groups into communication is installed on a surface of each of the heat generating bodies.

4 Claims, 17 Drawing Figures

HEAT TRANSFER APPARATUS

BACKGROUND OF THE INVENTION

The present invention relates to a heat transfer apparatus which is suited to the boiling cooling of high heat generating density members such as integrated circuits for electronic computers, power semiconductor devices including thyristors, and superconducting coils.

As a conventional method for promoting the boiling cooling of integrated circuit chips, there is the invention disclosed in U.S. Pat. No. 3,706,127. In this method, the chips are carried on a distributing board through solder bonding, and the surfaces of the chips are formed with a large number of metal whiskers (dendrites) by a metallurgical process. The aggregate of dendrites contains a large number of bubbling nuclei which are necessary for operating at a high temperature due to the heat generation of the integrated circuit chips and for generating the vapor bubbles of a dielectric liquid when the integrated circuit chips are immersed and operated in the dielectric liquid. Therefore, the heat generated by the integrated circuit chips can be promptly removed, and the temperature rise of the chips is suppressed even when large amounts of heat have been generated by the high speed operations of the electronic circuits built in the chips. With this method, however, such parameters as the growth interval and height of the dendrites and the size of voids included in the dendrite aggregate which function as the bubbling nuclei are governed by the process of dendrite growth. Since, in general, a surface structure produced by such metallurgical method is very fine, it is greatly effective for a low heat load. In contrast, when the heat flux of a heat generating surface increases, the generation of vapor becomes too active, and the surface is covered with a vapor film. As a result, the so-called burnout phenomenon in which the temperature of the surface rises suddenly is liable to occur. That is, the burnout heat flux is low, which leads to the disadvantage that the operating speed of a semiconductor device cannot be further increased because it has a limit value ascribable to the permissible quantity of heat generation which in turn is determined by the burnout heat flux.

Another method has been known wherein, as exemplified by U.S. Pat. No. 4,203,129, heat generating elements are furnished with a plate member having tunnel-like penetrant cavities and are immersed in a liquid coolant. In this example, the liquid is imbibed from below by a pumping action which occurs with the separation of bubbles from upper holes. Therefore, even when the quantity of heat generation is considerably large, the whole heat transfer surface is not covered with a vapor film, so that the burnout heat load is enhanced. With this method, however, almost no place for trapping vapor exists in the cavities, so that disadvantageously the performance is inferior at a low heat load.

SUMMARY OF THE INVENTION

An object of the present invention is to provide, in the cooling of heat generating elements of high heat generating density in integrated circuit chips etc., a heat transfer apparatus suited to boiling cooling in which a temperature difference necessary for conducting generated heat to a boiling medium is held small irrespective of the quantity of heat generation, with the result that the temperature of the heat generating elements is kept low.

The present invention is characterized in that a heat conductive member is installed on a heat generating element, said heat conductive member comprising a plurality of layers each of which includes cavities for stably holding vapor generating nuclei therein and holes for extricating generated vapor.

DESCRIPTION OF THE PREFERRED EMBODIMENTS

Figure 1:
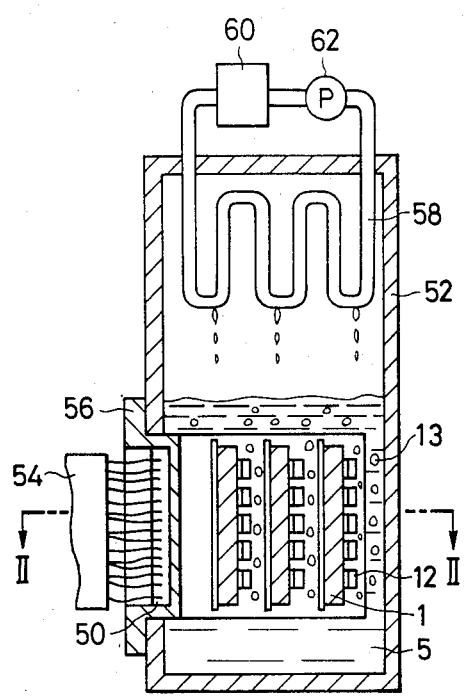
FIG. 1 is a vertical sectional view of a semiconductor device cooling system to which the present invention is applied.
Figure 2:
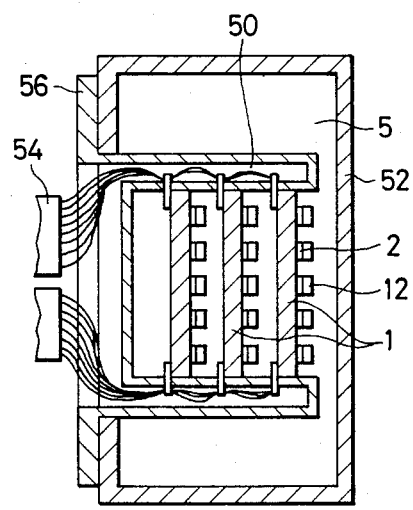
FIG. 2 is a sectional view taken along line II—II in FIG. 1.
Figure 3:
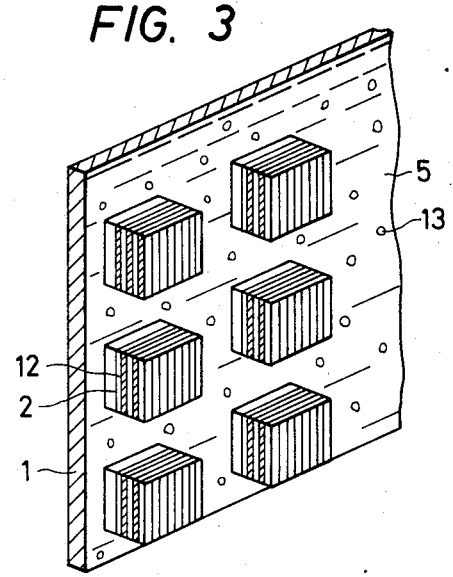
FIG. 3 is a perspective view of an embodiment of the present invention applied to the system in FIG. 1.

FIGS. 1 to 3 are views showing an example in which the present invention is applied to a cooling system for integrated circuit chips.

A plurality of wiring substrates 1, each of which carries a plurality of integrated circuit chips 2 thereon, are attached to a mother board 50, and they are immersed in a dielectric liquid, for example, fluorocarbon liquid within a sealed container 52. Wiring leads 54 which are connected to the chips 2 extend from the mother board 50 via the inside of a flange 56 to the outside of the sealed container 52. A condenser 58 is disposed in the upper part of the sealed container 52, and cooling water is circulated between this condenser and a tank 60 by a pump 62. Heat conductive members 12 are mounted on the integrated circuit chips 2, and vapor 13 generated in the stacks is cooled and condensed by the condenser 58 to return into the liquid in the lower part of the container 52.

Figure 4:
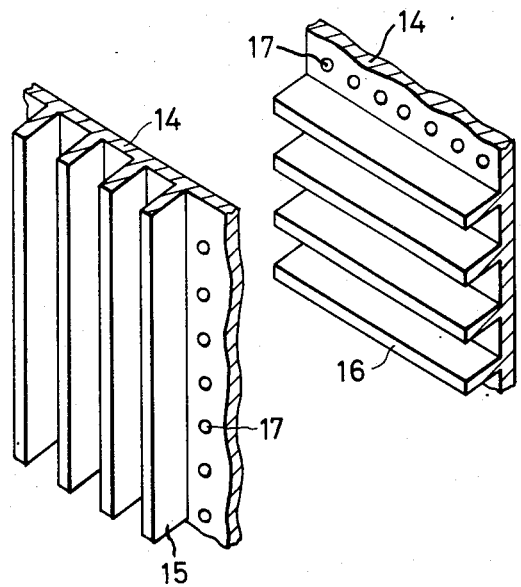
FIG. 4 is a perspective view of elements which constitute a pillar-shaped heat conductive member.
Figure 5:
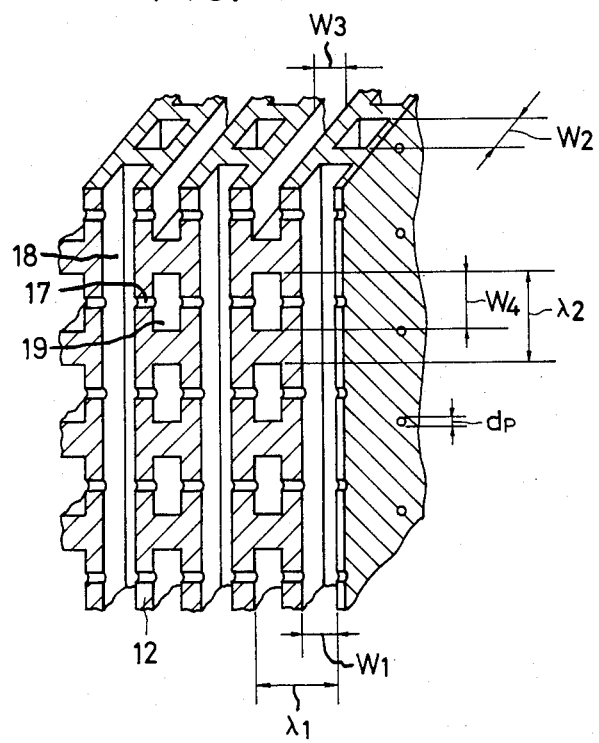
FIG. 5 is a perspective view showing the detailed structure of the pillar-shaped heat conductive member.

Each heat conductive member 12 is so constructed that perforated plates 14 with minute fins shown in FIG. 4 are stacked in a direction perpendicular to the surface of the IC chip 2. The minute fins 15 or 16 are disposed on only one surface of the thermally conductive plate 14, and have a rectangular cross section. Therefore, when the plates are stacked and joined, the flat end faces of the fore ends of the fins on one plate and the surface of the other plate on which no fin is provided are brought into contact and then joined. The parts of the plate 14 where the fins are not provided are formed with a large number of apertures 17 penetrating the plate. The minute structure composed of the fins and the apertures is fabricated by any of methods such as machining, rolling, etching, electron-beam processing, laser-beam processing and casting. The stacking and joining of the plates is performed by any of methods such as brazing and diffusion bonding. In this case, tunnel-like cavities are defined as shown in FIG. 5 by the fins and the surfaces of the plates on the opposite sides. When the plates are stacked in such a manner that the directions of the fins alternate to be vertical and horizontal as illustrated in FIG. 4, vertical tunnels 18 and horizontal tunnels 19 in FIG. 5 are formed after the joining operation. As illustrated in FIG. 5, the vertical tunnels 18 and the horizontal tunnels 19 communicate through the apertures 17.

Figure 6:
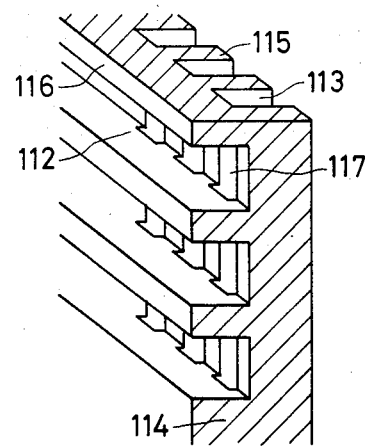
FIG. 6 is a perspective view of another embodiment of the element which constitutes the heat conductive member.
Figure 7:
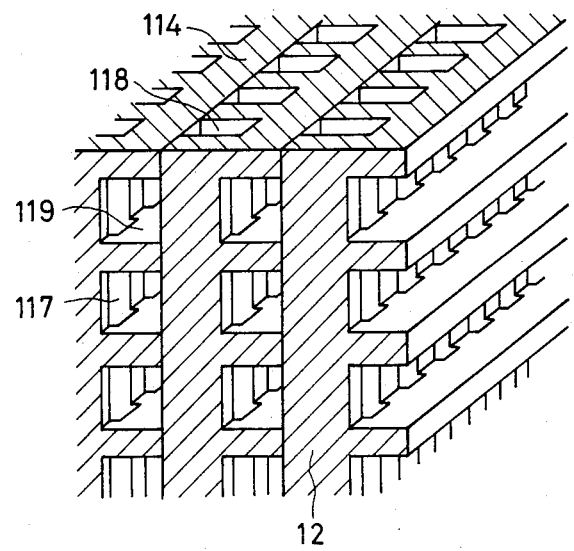
FIG. 7 is a perspective view of another embodiment of the detailed structure of the heat conductive member.

FIGS. 6 and 7 show another embodiment of the heat conductive member according to the present invention.

A perforated plate with minute fins, 114 shown in FIG. 6 is such that a thin plate is provided with slots 112 and 113 in directions intersecting to each other from both the front and rear sides thereof. The sum of the depths of the slots 112 and 113 is rendered greater than the thickness of the thin plate. Accordingly, openings 117 which bring the respective slots into communication are formed at the points of intersection of the corresponding slots. An assembly in which the plurality of perforated plates 114 with the minute fins are placed one over another and are respectively joined, is shown in FIG. 7. The slots 112 and 113 shown in FIG. 6 define tunnel-like cavities 118 and 119, and the respective tunnel-like cavities are held in communication by the openings 117. The present embodiment illustrates a case where the cross section of the slots is completely rectangular, so the maximum sectional length of the opening 117 is equal to the sectional width of the slot. However, the size of the opening can be readily set at an intended size in such a way that a burr is projected into the opening 117 by machining, that the shape of the bottom of the slot is rounded, or that after the slots are worked so as to render the sum of the depths of the respective intersecting slots smaller than the thickness of the thin plate, the openings are provided by a chemical process or the like.

Figure 8:
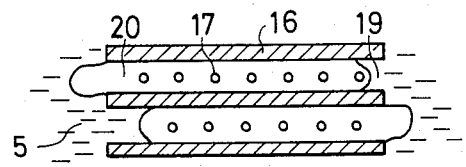
FIGS. 8-11 are views for explaining the operating situations of the heat conductive member.
Figure 9:
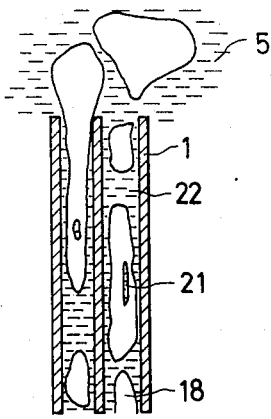
Figure 12:
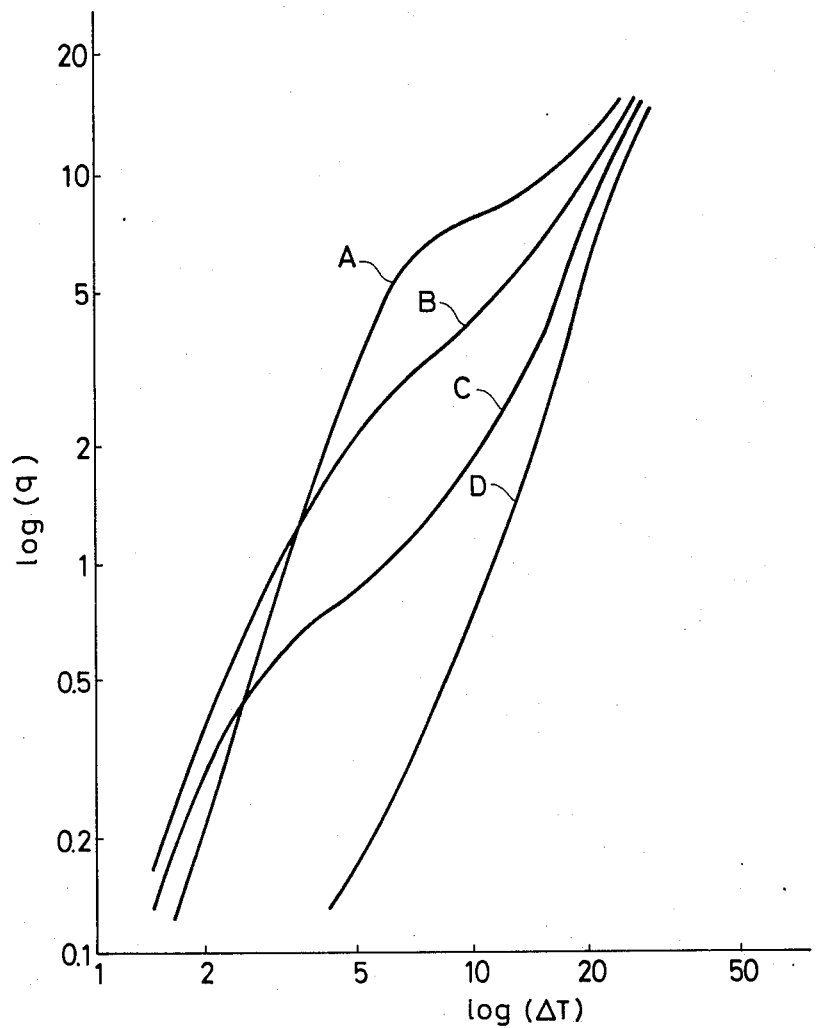
FIG. 12 is a graph showing the boiling heat transfer performances of the heat conductive surface illustrated in FIG. 5.
Figure 13:
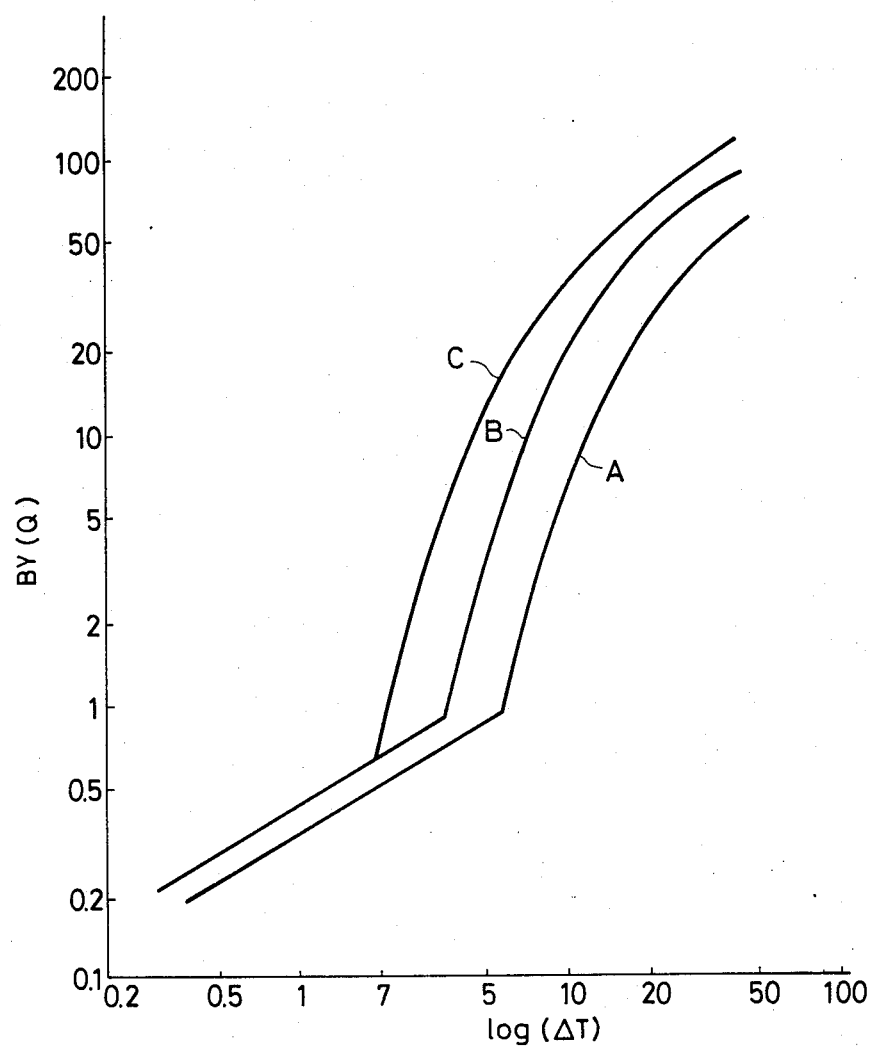
FIG. 13 is a graph showing the boiling heat transfer performances of the pillar-shaped heat conductive member.

FIGS. 8 and 9 serve to explain the functions of the horizontal tunnel 19 and the vertical tunnel 18 respectively. The horizontal tunnels 19 (FIG. 8) and the vertical tunnels 18 (FIG. 9) partitioned by the portions 16 having been the fins before the joining operation lie in a vessel which is filled with a boiling medium liquid 5. The horizontal tunnel 19 is difficult of extricating vapor bubbles because of its attitude and functions as a stable reservoir for vapor 20, while the vertical tunnel 18 is easy of extricating vapor 21 and therefore facilitates the entry of liquid 22. With the heat conductive member which includes such horizontal and vertical tunnels in combination, this heat conductive member is cooled principally owing to vaporization in the vertical tunnels 18 at the time of a high heat load, so that the burnout heat load is enhanced. On the other hand, even when the liquid in an excess amount enters the vertical tunnels 18 at the time of a low heat load, the vapor held in the horizontal tunnels 19 coupled with the vertical tunnels by the apertures 17 exists, and hence, the liquid vaporizes from gas-liquid interfaces formed in the apertures 17 coupling the vertical tunnels 18 and the horizontal tunnels 19, into bubbles which grow toward the interior of the vertical tunnels 18 and exclude the liquid out of the vertical tunnels 18. On this occasion, a high heat transfer coefficient is attained which is brought forth by the vaporization of the liquid and the violent motions of the liquid. Of course, the horizontal tunnels 19 are not always filled up with only the vapor, but some liquid enters the horizontal tunnels 19 due to the generation of the vapor and the consequent violent motions of the liquid in the surroundings and vaporizes on the wall surfaces of these horizontal tunnels, to bring forth a high heat transfer coefficient. Such dynamical phenomenon of the generation of the vapor and the entry of the liquid into the tunnels is governed by the density, viscosity coefficient and heat transfer coefficient of the fluid, the surface tension of the gas-liquid interface, and the dimensions of the detailed structure of the heat conductive member shown in FIG. 5 (the lengths $w_1$, $w_2$, $w_3$ and $w_4$ of the sides of the tunnel sections and the diameter $d_p$ of the aperture). For example, when the medium is boiled using one layer of horizontal tunnels 19, a very high boiling heat transfer coefficient is attained in a case where, as the vapor bubbles escape through the apertures, a suitable amount of liquid enters the tunnel through the other aperatures generating no vapor bubbles and then vaporizes. By way of example, FIG. 12 shows how the performance in the case of employing a panel structure composed of one layer of horizontal tunnels and openings and boiling fluorocarbon liquid FC-72 under the atmospheric pressure changes depending upon the diameters of the openings. The logarithm of the heat flux q (w/cm$^2$) with reference to a projection area (which does not include the increase of a substantial heat transfer area based on the provision of the panel structure) is taken on the axis of ordinates, while the logarithm of the difference $\Delta T$ (°C.) between the temperature of the heat transfer surface and the saturation temperature (56°C.) of the liquid is taken on the axis of abscissas. All the sample panel structures have the same tunnel dimensions (0.4 mm×0.25 mm), tunnel provision pitches (0.55 mm) and opening provision pitches (0.7 mm), and the samples differ in only the opening diameter. Curve A corresponds to an opening diameter of 0.25 mm, B to 0.2 mm, C to 0.1 mm, and D to 0.05 mm. Obviously, the sample having the opening diameter of 0.2 mm (A) and the sample having the opening diameter of 0.25 mm (B) are excellent in a range of $\Delta T=3$ to 15° C. Of course, the heat transfer coefficient attained by the single layer of tunnels does not agree with a heat transfer coefficient which is attained by the multilayer structure. However, it holds in both the single-layer structure and the multilayer structure that the panel structure dimensions adapted to bring forth the high heat transfer coefficient realize the foregoing dynamical mechanism which drives the generation of the vapor and the entry of the liquid into the tunnel. By the way, FIG. 13 shows the performance (curve C) in the case where five layers of the panel structure having the opening diameter of 0.25 mm, the performance of which has been illustrated in FIG. 12, are stacked so as to form the vertical tunnels and the horizontal tunnels as shown in FIG. 5 and where the stacked structure is used as a columnar heat conductive member to boil the fluorocarbon liquid FC-72. The circular cylinder of the columnar member has a diameter of 9 mm and a length of 10 mm. The axis of ordinates Q in FIG. 13 represents the quantity of heat (W) applied to the root of the circular cylinder, while the axis of abscissas $\Delta T$ represents the difference (°C.) between the temperature of the root of the circular cylinder and the saturation temperature (56° C.) of the liquid, both the axes being logarithmically indicated. The performance of a copper circular cylinder of the same dimensions which has a smooth surface (curve A) and the performance of a copper circular cylinder which is provided with only minute fins on the side and end faces thereof (curve B) are illustrated for the sake of comparisons. Among these samples, the multilayer structure heat transfer member exhibits the highest performance, and its burnout heat load reaches at least 100 W (watts) per chip, which is much greater than the value 54 W of the circular cylinder having the smooth surface and the value 85 W of the circular cylinder with the fins.

The optimum values of the opening diameters revealed via the above studies are 0.08–0.2 mm for a freon type coolant, 0.15–0.4 mm for a fluorocarbon type coolant, 0.04–0.08 mm for liquid nitrogen, and 0.08–0.15 mm for pure water. When the sectional dimensions of the tunnel is too small, a resistance to the flow of the vapor bubbles increases, and when they are too large, the entry of an excess amount of liquid is incurred. A size which is nearly equal to, or somewhat smaller than, the diameter of the vapor bubble to be formed is favorable. When such fluids as the liquid nitrogen, freon type coolant, fluorocarbon coolant and pure water are widely examined, the length of one side of the tunnel section should suitably be in a range of 0.2–2 mm.

The installation intervals of the tunnels ($\lambda_1$ and $\lambda_2$ in FIG. 5) are determined in such a way that the difference between them and the tunnel width, namely, the thickness of the portions having been the fins before the stacking and joining operations is set at a proper value. The width of the solid portions for partitioning the tunnels is important for determining the quantity of heat conduction within the heat conductive member. When the width is small, the number of the tunnels per unit volume of the heat conductive member increases, but heat becomes difficult to be conducted in the lengthwise direction of the heat conductive member. Accordingly, the temperature becomes too low in the part of the heat conductive member far from a heat generating source, and the effective function of the heat conductive member is hampered.

Figure 10:
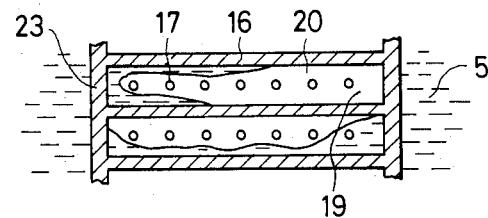
Figure 11:
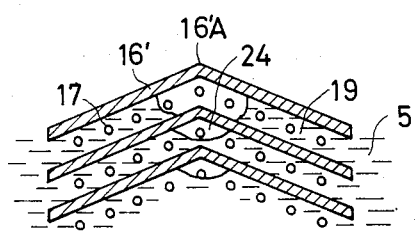

Methods for holding the vapor in the horizontal tunnel more stably are a method as shown in FIG. 10 wherein both the ends of the horizontal tunnel 19 are closed up by partition walls 23 so as to hold the vapor 20, and only the apertures 17 for coupling with the vertical tunnel are provided, and a method as shown in FIG. 11 wherein the shape of the minute fin to form the horizontal tunnel is put into an inverted V shape 16' beforehand, and the heat conductive member is used with the top 16'A of the inverted V shape located above, whereby a stable vapor reservoir 24 is formed near the top.

Any of the horizontal tunnel, the tunnel with its ends closed up, and the inverted V-shaped tunnel as described above holds the vapor reservoir reliably in the heat conductive member in the boiling at the time of a low heat load, and it sharply reduces the possiblity that the liquid will enter the tunnel in an excess amount to expel away vapor bubble generating nuclei and to cease the boiling heat transfer. However, it is not an indispensable condition to dispose the tunnel of such attitude or shape inside the heat conductive member. It has been experimentally verified that, even in a case where the attitude of the horizontal tunnel deviates from horizontality or where the tunnel is not in the shape of inverted V, the vapor bubbles are originally liable to be trapped in when such minute structure is immersed in the liquid, so a high heat transfer performance is usually attained.

In accordance with the heat conductive member-forming method according to the present invention, it is also possible that the dimensions of the minute structure composed of the tunnels and the apertures be changed in the lengthwise direction of the heat conductive member. More specifically, the lengths $w_1$ and $w_2$ of the sides of the section of the vertical tunnel in FIG. 5 are rendered large near the root of the heat conductive member close to the heat generating body and are rendered small near the front end of the heat conductive member. Then, near the root where a large amount of vapor is generated, the resistance to the flow of the escaping vapor can be lowered, while near the front end where the difference between the temperature of the wall of the heat conductive member and the liquid is small, finer tunnels are provided in large numbers, whereby the increase of the substantial heat transfer area is attained, and in turn, the increase of the quantity of heat transfer can be brought forth. Regarding the apertures, the dimensions can be similarly rendered different between near the root of the heat conductive member and near the front end thereof. As exemplified in FIG. 7, the panel structure dimensions which bring forth an excellent heat transfer performance differ depending upon the degree of superheat of the heat conductive wall surface. It is accordingly possible that the apertures of a diameter adapted to afford a high heat transfer coefficient be provided near the root of the heat conductive member where the degree of superheat is high, while the apertures of a diameter adapted to afford a high heat transfer coefficient with a low degree of superheat be provided near the front end of the heat conductive member.

While, in the above, the material of the heat generating body used for the verification of the present embodiment has been copper, it need not always be copper, but it may well be a different metal such as aluminum or a non-metallic material such as ceramics of high heat transfer coefficient or silicon, on the basis of the combination with the boiling liquid and the combination with the chip material.

Figure 14:
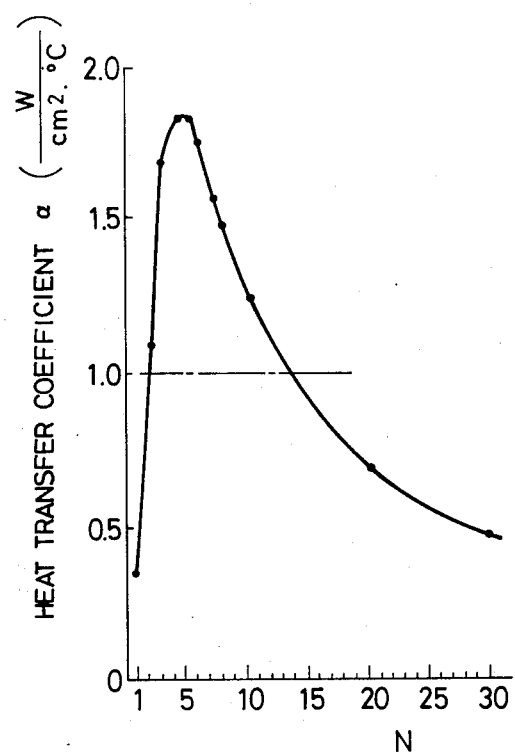
FIG. 14 is a diagram showing the relationship between the number of stacked layers and the coefficient of heat transfer.

FIG. 14 shows the relationship between the number of stacked layers N and the heat transfer coefficient $\alpha$, of the pillar-shaped heat conductive member in which the tunnels are formed in a plurality of layers as shown in FIG. 5. The axis of abscissas represents the number of stacked plates, namely, the number of layers of the tunnels, while the axis of ordinates represents the heat transfer coefficient $\alpha$ (W/cm$^2$·°C.) with reference to the whole surface area of the pillar-shaped heat conductive member. The surface area of the side surfaces of the pillar-shaped heat conductive member increases owing to the increase of the number of the stacked layers, but the surface areas of the upper and lower surfaces remain constant. When the number of the stacked layers N is 2–13, the heat transfer coefficient α becomes at least 1.0, i.e., at least three times greater than in the case of the single layer, and when the number of the stacked layers is 4 or 5, the highest heat transfer coefficient is attained. When the number of the stacked layers N increases, naturally the occupying volume of the pillar-shaped heat conductive member enlarges. In practical use, therefore, N may be properly selected within a range of 2–13 layers, desirably 2–7 layers in accordance with the quantity of heat generation of the heat generating body.

Figure 15:
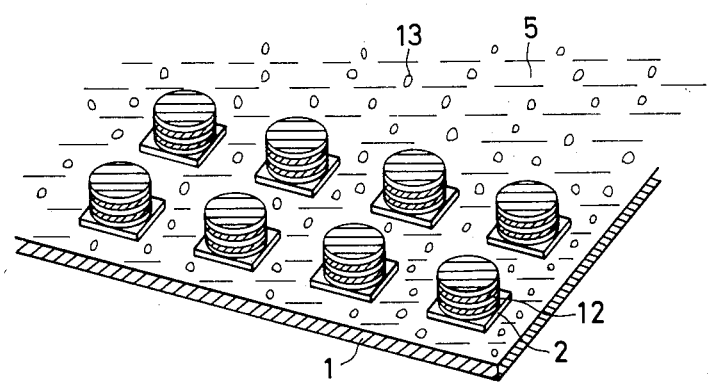
FIG. 15 is a perspective view of another embodiment of the present invention.
Figure 16:
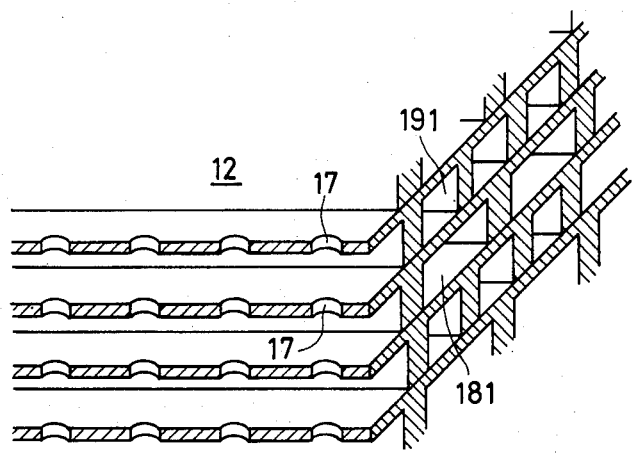
FIG. 16 is a perspective view of the essential portions of a pillar-shaped heat conductive member in FIG. 15.

Another embodiment of the present invention is shown in FIGS. 15 and 16. A substrate 1 is located horizontally. A heat conductive member 12 is such that tunnels 181 of large cross-sectional area and tunnels 191 of small cross-sectional area are alternately stacked, and that the respective tunnels 181 and 191 are held in communication by apertures 17. The tunnel 181 of large area functions as an emission passage for vapor owing to a low flow resistance of the vapor, while the tunnel 191 of small area functions as a cavity for holding the vapor owing to a high flow resistance of the vapor. That is, by making the sizes of the adjoining tunnels different, the large area tunnel 181 can play the role of the vertical tunnel 18 in FIG. 9, and the small area tunnel 191 the role of the lateral tunnel 19 in FIG. 8. While the present embodiment has illustrated the assembly in which the tunnels of the unequal sizes are stacked in the vertical direction, similar effects are achieved even when tunnels of unequal sizes are laterally disposed within an identical plane and are held in communication by apertures.

Figure 17:
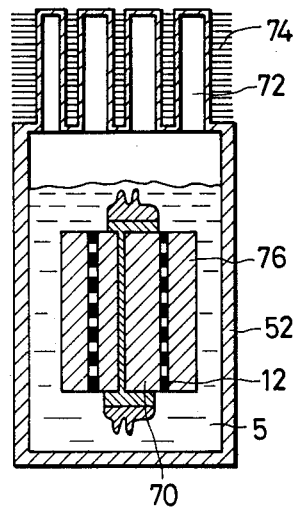
FIG. 17 is a view showing an essential vertical section of a thyristor cooling system to which the present invention is applied.

FIG. 17 shows an example in the case of applying the present invention to a thyristor cooling system. Numeral 70 indicates a thyristor, numeral 76 a pressure plate, and numeral 72 a condenser furnished with air-cooling fins 74. Heat generated by the thyristor is conducted to a heat conductive member 12 to boil and vaporize a surrounding liquid, and the resulting vapor is liquefied by the condenser to return to a lower part. Such process is repeated to cool the thyristor.

What is claimed is:

1. In an apparatus wherein heat conductive members are disposed on respective surfaces of a plurality of heat generating bodies immersed in a liquid coolant, and heat of the heat generating bodies is removed by boiling of the liquid coolant; a heat transfer apparatus characterized in that each heat conductive member is formed with a plurality of layers of first cavity groups and second cavity groups which extend elongately in a manner to be partitioned by thermally-conductive plate members, said first cavity groups and said second cavity groups being stacked alternately in a direction perpendicular to the surface of the corresponding heat generating body, said first cavity groups being adapted to restrict vapors generated in each cavity of said first cavity groups from flowing out of said cavity and stably hold the vapors in said cavity, while said second cavity groups have open ends through which the liquid coolant in each cavity of the second cavity groups flows directly and the vapors generated in the cavity of said second cavity groups flows out directly to the outside of the cavity of said second cavity groups and, that said plate members are provided with openings which bring into communication said first cavity groups and said second cavity groups of the layers adjoining each other and a cavity group of the outermost layer and an outer space of said heat conductive member.

2. A heat transfer apparatus as defined in claim 1, wherein said heat generating bodies are integrated circuit chips, and 2 to 13 layers of cavity groups are formed on the surface of said each integrated circuit chip.

3. A heat transfer apparatus as defined in claim 2, wherein said each cavity group consists of a large number of cavities extending in parallel, a length of one side of a section of said each cavity is 0.2 to 2.0 mm, and a diameter of said each opening is 0.04 to 0.4 mm.

4. A heat transfer apparatus as defined in claim 2, wherein each cavity group consists of a large number of cavities extending in parallel, and each cavity of said first cavity groups comprises a horizontal tunnel while each cavity of the second cavity groups comprises a vertical tunnel.

* * * * *